(12) United States Patent
Schulte et al.

(10) Patent No.: US 7,586,963 B2
(45) Date of Patent: *Sep. 8, 2009

(54) MODULAR DIODE LASER ASSEMBLY

(75) Inventors: Derek E. Schulte, Portland, OR (US); Yu Yan, Vancouver, WA (US); Robert J. Martinsen, West Linn, OR (US); Aaron L. Hodges, Hillsboro, OR (US); Scott R. Karlsen, Battle Ground, WA (US)

(73) Assignee: nLight Photonics Corporation, Vancouver, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/378,697

(22) Filed: Mar. 17, 2006

(65) Prior Publication Data
US 2007/0116074 A1   May 24, 2007

Related U.S. Application Data

(63) Continuation-in-part of application No. 11/313,068, filed on Dec. 20, 2005, now Pat. No. 7,436,868.

(60) Provisional application No. 60/739,185, filed on Nov. 22, 2005.

(51) Int. Cl.
H01S 3/04 (2006.01)
(52) U.S. Cl. ............................... 372/36; 372/34
(58) Field of Classification Search ............ 372/34–36, 372/50.12–50.124; 438/26–28
See application file for complete search history.

(56) References Cited

U.S. PATENT DOCUMENTS

| | | | |
|---|---|---|---|
| 3,622,906 A | 11/1971 | Nyul | |
| 3,827,059 A | 7/1974 | Rambauske | |
| 4,716,568 A | 12/1987 | Scifres et al. | |
| 4,719,631 A | 1/1988 | Conaway | |
| 4,828,357 A | 5/1989 | Arata et al. | |
| 5,048,911 A | 9/1991 | Sang et al. | |
| 5,077,750 A | 12/1991 | Pocholle et al. | |
| 5,105,430 A | 4/1992 | Mundinger et al. | |
| 5,168,401 A | 12/1992 | Endriz | |
| 5,305,344 A | 4/1994 | Patel | |
| 5,515,391 A | 5/1996 | Endriz | |

(Continued)

FOREIGN PATENT DOCUMENTS

JP          04 264789          9/1992

(Continued)

OTHER PUBLICATIONS

R. P. Edwin, Stripe Stacker for Use with Laser Diode Bars, Optics Letters, Jan. 15, 1995, pp. 222-224, vol. 20, No. 2, Publisher: Optical Society of America.

*Primary Examiner*—Minsun Harvey
*Assistant Examiner*—Joshua King
(74) *Attorney, Agent, or Firm*—Patent Law Office of David G. Beck

(57) ABSTRACT

An extremely versatile diode laser assembly is provided, the assembly comprised of a plurality of diode laser subassemblies mounted to a stepped cooling block. The stepped cooling block allows the fabrication of a close packed and compact assembly in which individual diode laser subassembly output beams do not interfere with one another.

8 Claims, 7 Drawing Sheets

U.S. PATENT DOCUMENTS

| | | | |
|---|---|---|---|
| 5,610,930 A * | 3/1997 | Macomber et al. | 372/36 |
| 5,668,822 A | 9/1997 | Tada | |
| 5,764,675 A * | 6/1998 | Juhala | 372/50.1 |
| 5,825,551 A | 10/1998 | Clarkson et al. | |
| 5,887,096 A | 3/1999 | Du et al. | |
| 5,898,211 A | 4/1999 | Marshall et al. | |
| 5,909,458 A | 6/1999 | Freitas et al. | |
| 5,987,043 A * | 11/1999 | Brown et al. | 372/36 |
| 6,028,722 A | 2/2000 | Lang | |
| 6,044,096 A | 3/2000 | Wolak | |
| 6,057,871 A * | 5/2000 | Peterson | 347/238 |
| 6,075,912 A | 6/2000 | Goodman | |
| 6,115,185 A | 9/2000 | Du et al. | |
| 6,229,831 B1 * | 5/2001 | Nightingale et al. | 372/36 |
| 6,240,116 B1 * | 5/2001 | Lang et al. | 372/50.12 |
| 6,266,359 B1 | 7/2001 | Taheri et al. | |
| 6,324,320 B1 | 11/2001 | Goodman | |
| 6,327,285 B1 | 12/2001 | Wang | |
| 6,377,410 B1 | 4/2002 | Wang et al. | |
| 6,462,883 B1 | 10/2002 | Wang et al. | |
| 6,552,853 B2 | 4/2003 | Goodman | |
| 6,556,352 B2 | 4/2003 | Wang et al. | |
| 6,636,538 B1 | 10/2003 | Stephens | |
| 6,673,699 B2 * | 1/2004 | Hubbard et al. | 438/460 |
| 6,680,800 B1 | 1/2004 | Schreiber et al. | |
| 6,683,727 B1 | 1/2004 | Goring et al. | |
| 6,700,709 B1 | 3/2004 | Fermann | |
| 6,765,725 B1 | 7/2004 | Fermann et al. | |
| 6,778,732 B1 | 8/2004 | Fermann | |
| 6,898,222 B2 * | 5/2005 | Hennig et al. | 372/36 |
| 6,975,659 B2 | 12/2005 | Nagano et al. | |
| 2003/0063391 A1 | 4/2003 | Wang et al. | |
| 2004/0114648 A1 * | 6/2004 | Nagano et al. | 372/36 |
| 2004/0264862 A1 | 12/2004 | Nagano | |
| 2005/0063433 A1 | 3/2005 | Treusch et al. | |
| 2005/0069266 A1 * | 3/2005 | Kouta et al. | 385/92 |
| 2005/0254539 A1 | 11/2005 | Klimek | |
| 2006/0018356 A1 * | 1/2006 | Voss et al. | 372/50.12 |

FOREIGN PATENT DOCUMENTS

| | | |
|---|---|---|
| WO | WO 2004/034113 | 4/2004 |
| WO | WO 2005/039001 | 4/2005 |
| WO | WO 2005/119863 | 12/2005 |

* cited by examiner

MODULAR DIODE LASER ASSEMBLY

CROSS-REFERENCE TO RELATED APPLICATION

This application is a continuation-in-part of U.S. patent application Ser. No. 11/313,068, filed Dec. 20, 2005, now U.S. Pat. No. 7,436,868 and claims the benefit of U.S. Provisional Patent Application Ser. No. 60/739,185, filed Nov. 22, 2005, the disclosures of which are incorporated herein by reference for any and all purposes.

FIELD OF THE INVENTION

The present invention relates generally to semiconductor lasers and, more particularly, to a laser assembly that permits the output from multiple diode lasers to be effectively and efficiently combined.

BACKGROUND OF THE INVENTION

High power diode lasers have been widely used in industrial, graphics, medical and defense applications. The beam divergence and the relatively low output power of such lasers has, however, limited their usefulness.

The output beam of a diode laser is asymmetric due to the beam having a higher angular divergence in the direction perpendicular to the diode junction of the emitter (i.e., the fast axis of the emitter) than in the direction parallel to the diode junction (i.e., the slow axis of the emitter). As a result of the differences in beam divergence, the cross section of the output beam of a diode laser has an elliptical shape, typically requiring the use of a cylindrical lens or other optics to alter the divergence characteristics and shape the output beam for its intended use. Although beam optics can be used on individual diode lasers, in the past the use of such optics has made it difficult to combine multiple diode laser beams into a single beam of sufficient output power to suit many applications.

One method of combining the output beams from multiple lasers is disclosed in U.S. Pat. No. 4,828,357. As shown, the output from each laser is directed using multiple mirrors in order to form a bundle of parallel beams or to cause the beams to converge into a relatively narrow region. The patent discloses that if greater power is required than can be generated by a single beam bundle, multiple bundles of parallel beams can be combined to form a beam bundle of even greater power. The patent does not specifically disclose the use of laser diodes nor does the patent disclose altering the beam shape of the individual laser beams prior to directing the beams into the beam bundle.

U.S. Pat. No. 6,075,912 discloses an alternate technique for combining the output beams from multiple lasers into a single beam. In the disclosed system the output beam of each laser impinges on a discrete facet of a multi-faceted beam deflector. By properly positioning each laser relative to the facets of the beam deflector, all of the output beams are deflected into an optical fiber. The patent discloses interposing an optical system between each laser source and the corresponding beam deflector facet in order to properly image the output beam onto the deflector facet. The patent also discloses interposing an output optical system between the beam deflector and the optical fiber, the output optical system imaging the deflected output beams as a focused group of beam images into the core of the input face of the optical fiber.

U.S. Pat. No. 4,716,568 discloses a laser array assembly formed from a plurality of linear diode laser array subassemblies stacked one above the other, each of the subassemblies electrically connected to the adjacent subassembly. Each linear diode laser array subassembly is made up of a plurality of individual laser emitters mounted in thermal communication with a conductive plate. Although the patent discloses several ways of stacking the subassemblies in order to form the desired 2-D laser array, the patent does not disclose any optical systems for use in combining the output beams of the individual emitters and/or subassemblies.

U.S. Pat. No. 5,887,096 discloses an optical system that is used to guide the output beams from a rectilinear diode laser array to form a substantially uniform radiation field or pattern. In one disclosed embodiment, the optical system utilizes a plurality of reflectors where each reflector corresponds to an individual diode laser. In a preferred embodiment, the centers of the irradiated surface areas of the individual reflectors are situated in a straight line with the distance between a reflector and the corresponding diode laser exit facet being the same for each diode laser/reflector pair.

U.S. Pat. No. 6,240,116 discloses a diode laser array designed to achieve high beam quality and brightness. In one embodiment, the array includes a pair of diode arrays in which the emitting surface planes of the two arrays are displaced from one another in a direction parallel to the one of the optical axes defined by the arrays. The optical axes of the two arrays are offset from each other in a direction perpendicular to one of the optical axes. Lenses are used to reduce the divergence of the output beams. In at least one embodiment, reflectors are used to reduce or eliminate the dead spaces between adjacent collimated beams.

Although a variety of diode laser arrays and beam combining systems have been designed, what is needed in the art is a versatile diode laser assembly which can be easily tailored to specific application needs. The present invention provides such a diode laser assembly.

SUMMARY OF THE INVENTION

The present invention provides a diode laser assembly comprised of a plurality of diode laser subassemblies mounted to a stepped cooling block. The stepped cooling block is comprised of two adjacent sections, with each section including a plurality of mounting surfaces arranged in a stepped, or staircase, fashion. The mounting surfaces of the two adjacent sections are non-coplanar with the mounting surfaces of one of the sections being higher than the adjacent mounting surfaces of the other section. In at least one embodiment, mounted to the mounting surface of each step of the upper section of the stepped cooling block is a diode laser subassembly. In at least one other embodiment, mounted to the mounting surface of each step of the lower section of the stepped cooling block is a diode laser subassembly.

Each diode laser subassembly of the diode laser assembly includes a mounting block which, during diode laser subassembly mounting, is thermally coupled to the corresponding mounting surface of the cooling block. Mounted to a surface of the mounting block is a diode laser submount. The diode laser submount can be fabricated from either an electrically insulating material or an electrically conductive material. Mounted to a surface of the diode laser submount is the diode laser. The diode laser can be either a single emitter diode laser or a multi-emitter diode laser. In at least one embodiment the diode laser submount includes a pair of contact pads that are electrically coupled to the diode laser, thus providing a means of supplying power to the individual lasers.

In at least one preferred embodiment of the invention, a clamping member compresses each diode laser submount against the corresponding mounting block, and the mounting block against the corresponding mounting surface of the cooling block. Preferably the clamping members are held in place with bolts coupled to the cooling block. The clamping members preferably hold electrical interconnects against electrical contact pads located on the diode laser submounts. In an alternate embodiment of the invention, at least one threaded means (e.g., bolt, all-thread and nut assembly, etc.) attaches each diode laser subassembly to the corresponding mounting surface of the cooling block.

In at least one preferred embodiment of the invention, a beam conditioning lens is attached, for example by bonding, to each diode laser subassembly mounting block such that the output beam(s) of the diode laser passes through the lens. In one embodiment the beam conditioning lens is a cylindrical lens. Preferably a second beam conditioning lens is also attached, for example by bonding, to each diode laser subassembly mounting block such that the output beam(s) of the diode laser from a different diode laser subassembly passes through the lens. The different diode laser subassembly can be an adjacent subassembly. Alternately one or more diode laser subassemblies can be located between the second beam conditioning lens and the subassembly containing the diode laser that produces the output beam that passes through the second beam conditioning lens.

In at least one embodiment of the invention, a cooling source is coupled to the cooling block. The cooling source can be coupled to the cooling block bottom surface, one or more cooling block side surfaces, or both. The cooling source can be integrated within the cooling block. The cooling block can have a flat bottom surface, thus creating different separation distances between each diode laser subassembly mounting surface of the cooling block and the cooling block bottom surface. Alternately the cooling block can have an inclined bottom surface, thus causing the separation distances between each diode laser subassembly mounting surface of the cooling block and the cooling block bottom surface to be the same.

A further understanding of the nature and advantages of the present invention may be realized by reference to the remaining portions of the specification and the drawings.

DESCRIPTION OF THE SPECIFIC EMBODIMENTS

The present invention provides the system designer with the means to tailor a diode laser assembly to the specific needs of a particular application. In order to provide this versatility, the system utilizes a diode laser subassembly that can be mounted in a variety of configurations.

Figure 1:
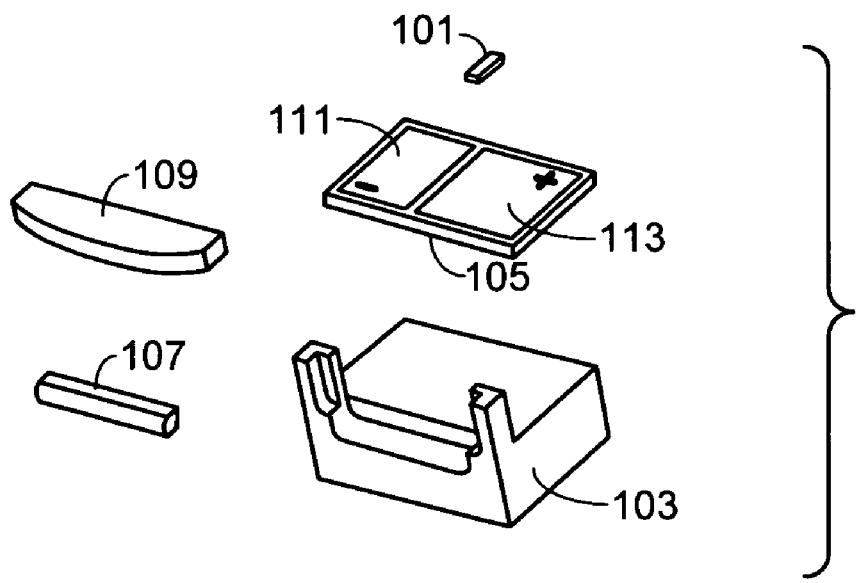
FIG. 1 is a perspective view of the primary components of a diode laser subassembly in accordance with the invention.
Figure 2:
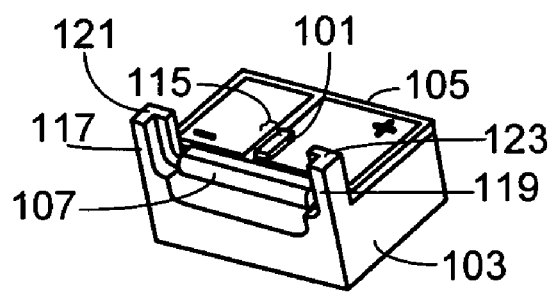
FIG. 2 is a perspective view of the assembled diode laser subassembly of FIG. 1, minus the second conditioning lens.
Figure 3:
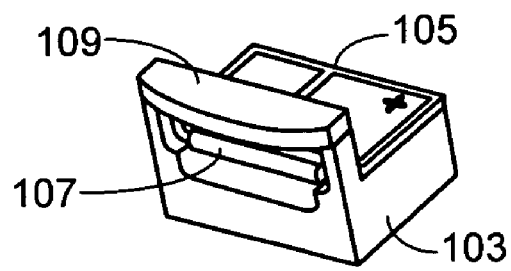
FIG. 3 is a perspective view of the assembled diode laser subassembly of FIG. 1, including the second conditioning lens associated with another (not shown) diode laser subassembly.

FIGS. 1-3 illustrate a diode laser subassembly utilizing a single emitter diode laser 101. In addition to the diode laser 101, the primary components associated with the diode laser subassembly are the subassembly mounting block 103, submount 105, first conditioning lens 107 and second conditioning lens 109. As described in detail below, although second conditioning lens 109 is mounted to subassembly mounting block 103, it is used with the output beam of a diode laser mounted to another diode laser subassembly that is not shown in FIGS. 1-3.

Subassembly mounting block 103 serves several functions. First, it provides an efficient thermal path between diode laser 101 and the cooling block which is shown in later figures. Second, it provides a convenient means for registering the various components of the diode laser assembly, thereby lowering the manufacturing costs associated with the overall assembly. Third, it provides a convenient means for registering the individual diode laser subassemblies within the cooling block as shown below. In order to provide the desired diode laser cooling, preferably subassembly mounting block 103 is fabricated from a material with a high coefficient of thermal conductivity (e.g., copper).

Diode laser 101 is not attached directly to subassembly mounting block 103, rather it is mounted to submount 105. Preferably submount 105 as well as the means used to attach submount 105 to mounting block 103 are both materials with a high coefficient of thermal conductivity, thus insuring that the heat produced by diode laser 101 is efficiently coupled to mounting block 103. Additionally the coefficient of thermal expansion for the material selected for submount 105 is matched, to the degree possible, to diode laser 101 in order to prevent de-bonding or damage to the laser during operation. In at least one embodiment of the invention, submount 105 is soldered to mounting block 103 using indium solder.

Submount 105 can be fabricated from either an electrically conductive (e.g., copper, copper tungsten, etc.) or an electrically insulative (e.g., aluminum nitride, beryllium oxide, CVD diamond, silicon carbide, etc.) material. In the embodiment illustrated in FIGS. 1-3, submount 105 is fabricated from an electrically insulating ceramic. The material used to bond diode laser 101 to submount 105 is selected, at least in part, on the composition of submount 105 and/or the composition of any layers (e.g., contact pads) interposed between submount 105 and diode laser 101. In the illustrated embodiment, electrically conductive contact pads 111/113 are deposited or otherwise formed on the top surface of submount 105. Contact pads 111/113 can be formed, for example, of gold over nickel plating while a gold-tin bonding material can be used to bond diode laser 101 to contact pad 113. It will be appreciated that there are a variety of materials well known in the industry that are suitable for use as contact pads as well as diode laser bonding material.

In a preferred embodiment of the invention, one contact (e.g., anode) of diode laser 101 is on its bottom surface, thus allowing one diode contact to be made by bonding the diode laser to one of the contact pads (e.g., pad 113) using an electrically conductive material. A wire bond or ribbon bond 115 is then used to electrically couple the second contact (e.g., cathode) of each diode laser to the second contact pad 111. It will be appreciated that the invention is not limited to this contact arrangement. For example, a pair of wire or ribbon bonds can be used to couple the diode laser to a pair of contact pads.

First conditioning lens 107, which in at least one embodiment is a cylindrical lens, is properly positioned relative to diode laser 101 using the extended arm portions 117 and 119 of mounting block 103. Typically lens 107 is located immediately adjacent to the exit facet of diode laser 101. Once lens 107 is properly positioned, it is bonded into place. The purpose of conditioning lens 107 is to reduce the divergence of diode laser 101 in the fast axis, preferably to a value that is the same as or less than the divergence in the slow axis.

Figure 4:
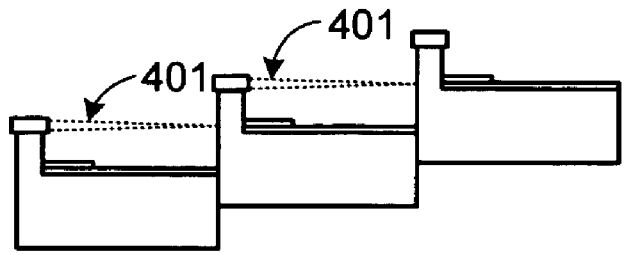
FIG. 4 illustrates the relationship between the second conditioning lens and a specific diode laser subassembly.
Figure 5:
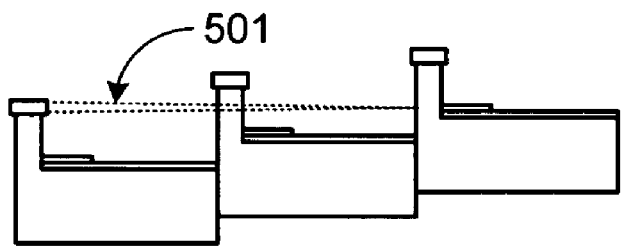
FIG. 5 illustrates the relationship between the second conditioning lens and a specific diode laser subassembly different from that shown in FIG. 4.

In order to properly condition the output beam of diode laser 101, preferably a second conditioning lens 109 is used. It should be understood that the specific second conditioning lens 109 shown in FIGS. 1-3, although mounted to the top surfaces 121 and 123 of respective arm portions 117 and 119, is not used to condition the beam from the illustrated diode laser 101. Rather the illustrated conditioning lens 109 is used to condition the output beam from an adjacent diode laser subassembly (e.g., beam 401 in FIG. 4), or the output beam from a diode laser subassembly that is more than one subassembly removed from the subassembly (e.g., beam 501 in FIG. 5). It will be appreciated that the focal length of second conditioning lens 109 as well as the height of arm portions 117 and 119 is dependent on which diode laser output beam is intended to pass through which second conditioning lens (i.e., the number of diode laser subassemblies separating the second conditioning lens from the diode laser source).

Figure 6:
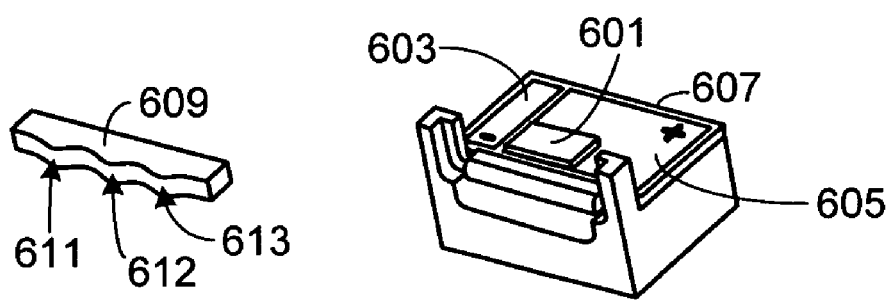
FIG. 6 is an illustration of a diode laser subassembly similar to that shown in FIGS. 1-3, utilizing a three-stripe diode laser rather than a single stripe diode laser.

Although the diode laser subassembly shown in FIGS. 1-5 utilizes a single emitter, the present invention is equally applicable to multi-emitter diode lasers. For example, FIG. 6 is an illustration of a diode laser subassembly utilizing a three-stripe diode laser 601. Due to the size of diode laser 601, the contact pads 603/605 on submount 607 are typically of a different size than those on submount 105 used with the single emitter diode laser. Additionally the second conditioning lens (i.e., lens 609) is multi-faceted (i.e., facets 611-613) in order to properly condition the individual output beams of diode laser 601.

Figure 7:
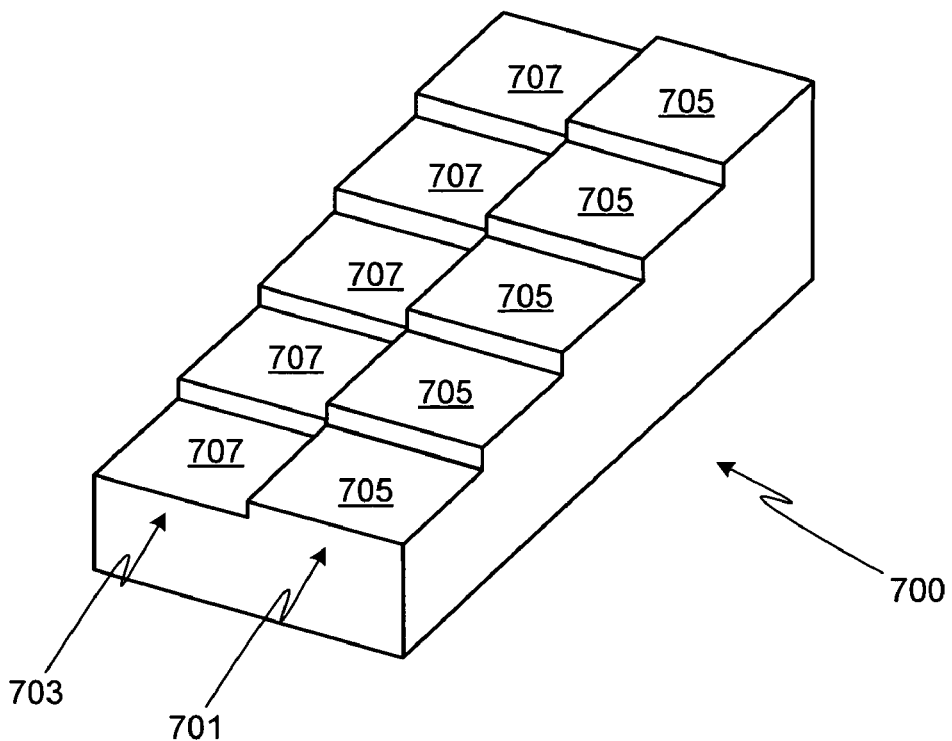
FIG. 7 is an illustration of a cooling block for use with a diode laser subassembly such as those shown in FIGS. 1-6.

FIG. 7 is a perspective view of a preferred cooling block 700 for use with the previously described diode laser subassemblies. As shown, cooling block 700 includes two adjacent sections 701 and 703, with one of the sections (i.e., section 701) raised relative to the other section (i.e., section 703). Both the mounting surfaces 705 of upper section 701 and the mounting surfaces 707 of lower section 703 are formed in a staircase, or stepped, fashion. As shown, adjacent mounting surfaces of the two sections are non-coplanar with the mounting surfaces of one of the sections being higher than the adjacent mounting surfaces of the other section.

The previously described diode laser subassemblies can be mounted to either upper section 701 or lower section 703 of cooling block 700. Either section provides a plurality of the desired stair-stepped mounting surfaces, thus allowing the subassemblies to be vertically offset from one another such that the output beams from the diode laser subassemblies can exit the assembly unimpeded.

Figure 8:
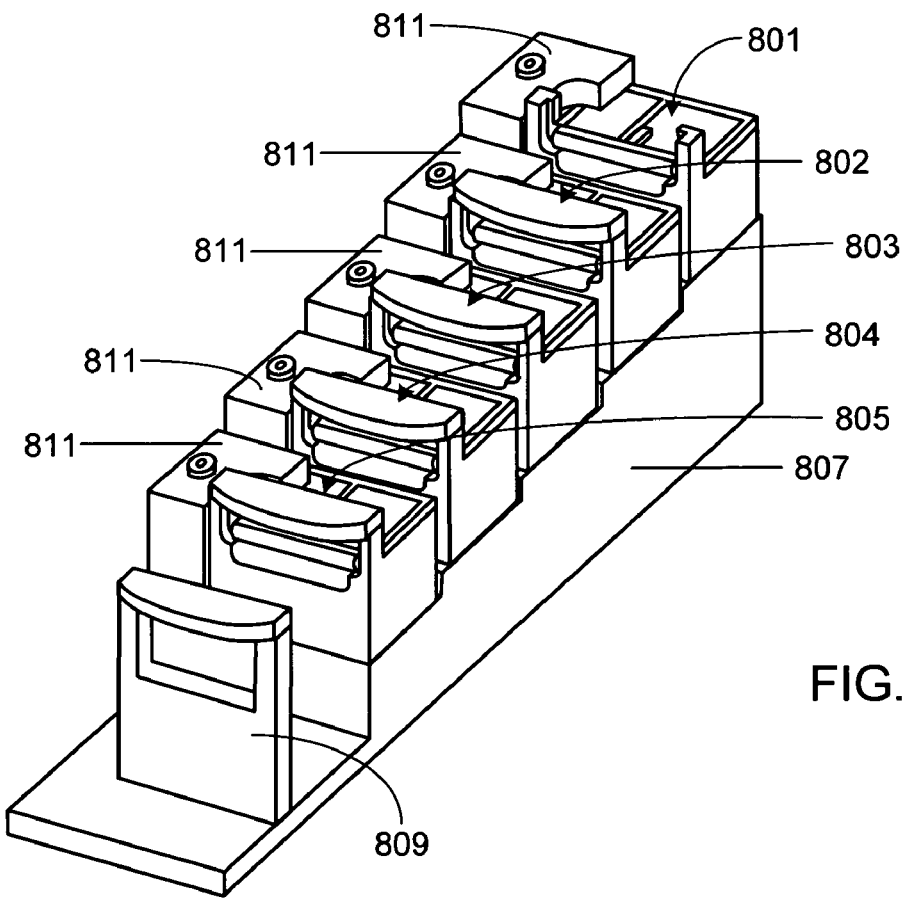
FIG. 8 is an illustration of a cooling block in which multiple diode laser subassemblies are clamped to the upper cooling block section.
Figure 9:
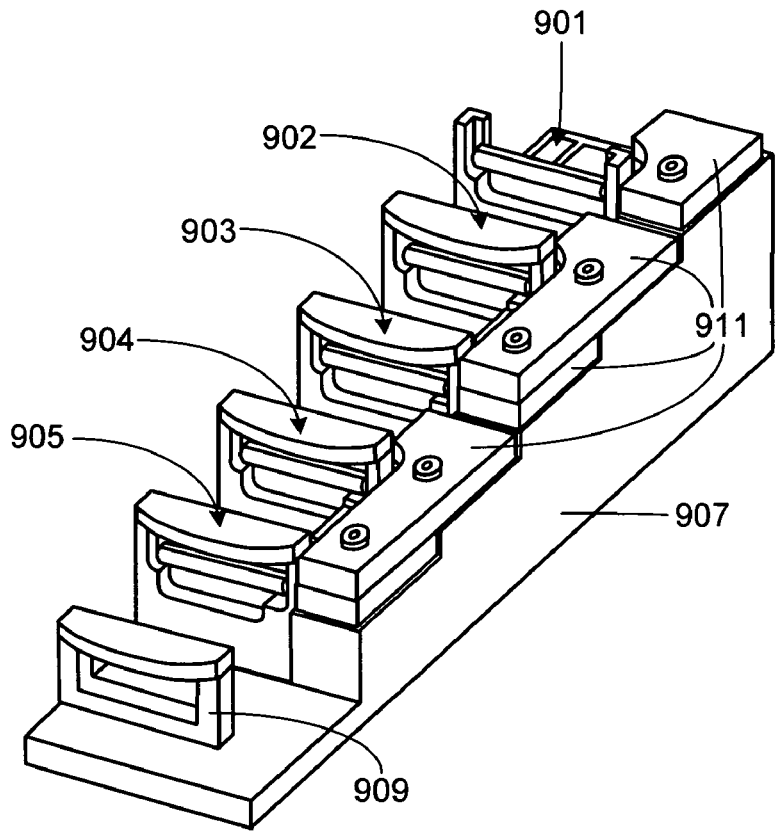
FIG. 9 is an illustration of a cooling block in which multiple diode laser subassemblies are clamped to the lower cooling block section.

Exemplary embodiments are shown in FIGS. 8 and 9. In FIG. 8 five diode laser subassemblies 801-805 are positioned on the upper mounting surfaces (e.g., surfaces 705) of cooling block 807 while in FIG. 9 five diode laser subassemblies 901-905 are positioned on lower mounting surfaces (e.g., surfaces 707) of cooling block 907. In the illustrated embodiments, the second conditioning lens for each subassembly is located on the arm portions of the adjacent subassembly mounting block. It will be appreciated that in the illustrated embodiments the uppermost subassembly, i.e., subassembly 801 in FIG. 8 and subassembly 901 in FIG. 9, does not include a second conditioning lens and that the second conditioning lens for the lowermost subassembly, i.e., subassembly 805 in FIG. 8 and subassembly 905 in FIG. 9, is simply mounted to a stand alone lens carrier, i.e., lens carrier 809 in FIG. 8 and lens carrier 909 in FIG. 9. The stand alone lens carrier, i.e., carrier 809 or 909, can either be integral to the cooling block, i.e., machined from the same material, or it can be an independent carrier that is mounted to the cooling block.

Although any of a variety of means can be used to mount the subassemblies to the cooling block, in the embodiments illustrated in FIGS. 8 and 9 each diode laser subassembly is clamped to the cooling block with a clamp member, i.e., clamp members 811 in FIG. 8 and clamp members 911 in FIG. 9. The clamp members hold the diode laser subassemblies in place and insure that good thermal contact is made between subassembly mounting blocks 103 and the cooling block. Depending upon the size of the clamping members as well as the location of the subassembly contact pads (e.g., pads 111/113), the clamping members can also be used as a means of electrically contacting one or both contact pads. The clamping members can either make electrical contact through direct contact or by pressing an electrical contact against one or both pads, the electrical interconnect being interposed between the clamping members and the contact pads on the submounts. During use, preferably either the cooling block is thermally coupled to a cooling source (e.g., thermoelectric cooler), or the cooling source is integrated within the cooling block (e.g., integral liquid coolant conduits coupled to a suitable coolant pump).

As the cooling block (e.g., blocks 807 and 907) is comprised of a series of steps onto which the diode laser subassemblies are mounted, the cooling rate and thus the operating temperature of the individual laser subassemblies varies depending upon the distance between the cooling source coupled to the cooling block and the individual subassemblies. Since the operating wavelength of a diode laser is temperature dependent, the inventors have found that the operating temperature variations between subassemblies that arise due to the stepped cooling block and the use of a bottom mounted cooling source can be used to match diode laser subassembly wavelengths. Accordingly in at least one embodiment of the invention, the output wavelength of each subassembly is determined based on the subassembly's position on the cooling block. Then each subassembly is positioned on the cooling block to provide the closest possible match to the desired output wavelength of the entire assembly.

Figure 10:
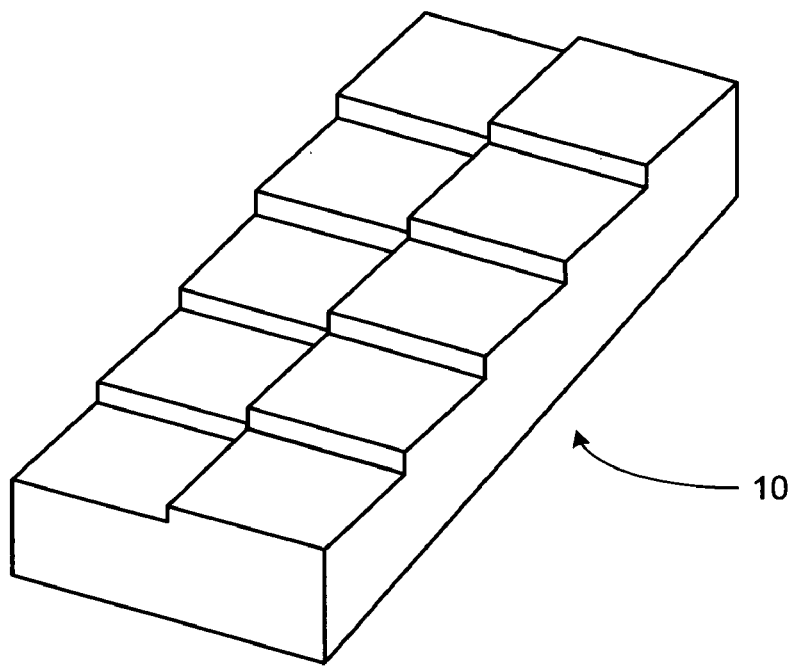
FIG. 10 illustrates a cooling block with an inclined cooling plane.

Although the figures described above illustrate at least one preferred embodiment of the invention, it will be appreciated that there are numerous minor variations that are clearly envisioned by the inventors. For example, FIG. 10 illustrates an alternate embodiment of a cooling block in which the bottom surface 1001 of the cooling block is inclined. As a result of this configuration, each mounting surface is the same distance from the bottom surface 1001, thus maintaining the same cooling rate for each mounted diode laser subassembly (not shown) even when thermally coupling the cooling source to the bottom surface (i.e., surface 1001) of the cooling block.

Figure 11:
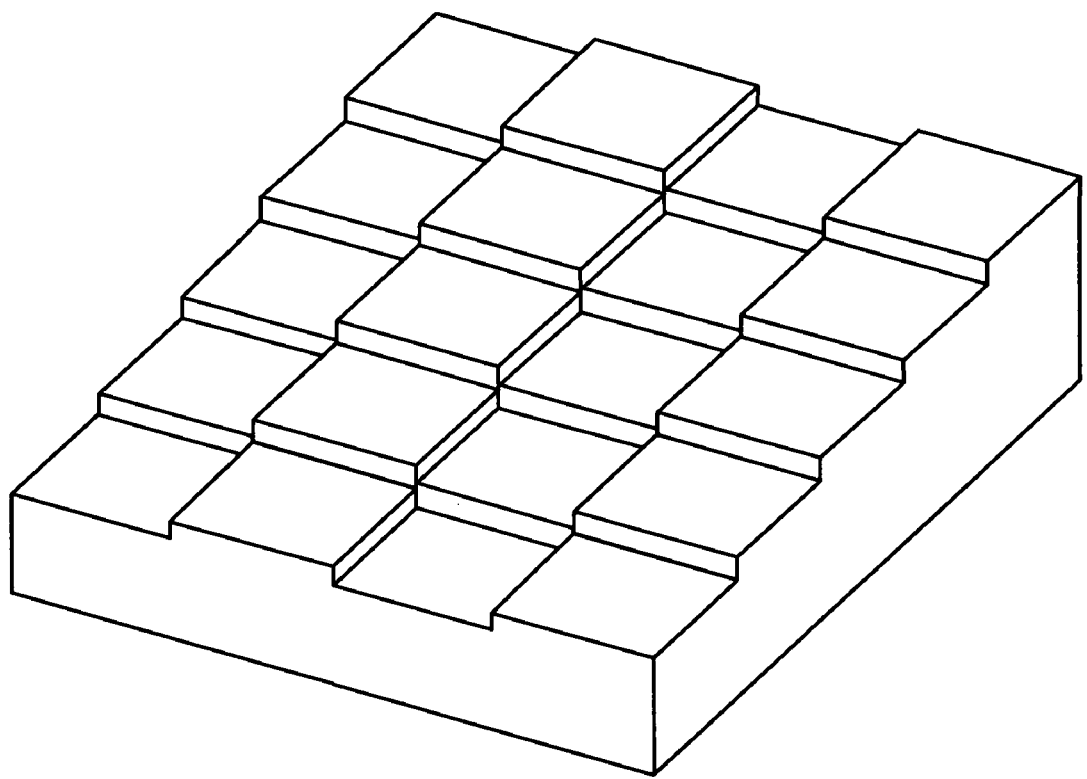
FIG. 11 illustrates a cooling block configured to accommodate two rows of diode laser subassemblies.
Figure 11:

In the above figures, the illustrated exemplary configurations include only a single row of subassemblies. It should be appreciated, however, that assemblies in accordance with the invention can include either more or less than the five diode laser subassemblies shown in FIGS. 8 and 9. Additionally, assemblies that contain more than a single row of diode laser subassemblies can be fabricated using the present invention. For example, FIG. 11 illustrates a cooling block 1100 that can be used with a total of ten diode laser subassemblies, five per row. The output beam from each row can either be combined using known optical techniques, or the assembly can be used to produce two separate output beams.

Figure 12:
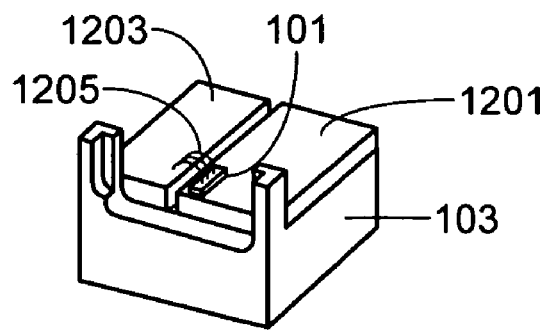
FIG. 12 illustrates portions of a diode laser subassembly that utilizes an electrically conductive submount.

As previously noted, the diode laser subassemblies of the present invention can utilize either electrically insulating or electrically conducting submounts as well as any of a variety of different diode laser contacting arrangements. Thus the submount/contact arrangement shown in FIGS. 1-3 and 6 is only an exemplary configuration and should not be viewed as a limitation of the present invention. For example, FIG. 12 illustrates portions of a diode laser subassembly that utilize an electrically conductive submount 1201. In this embodiment diode laser 101 is attached to submount 1201 with an electrically and thermally conductive solder or bonding material. As a consequence, one contact to diode laser 101 is made via electrically conductive submount 1201, directly or via subassembly mounting block 103 and/or the cooling block (not shown). Of course if electrical contact is made via subassembly mounting block 103, then an electrically conductive solder or bonding material must be used to attach submount 1201 to the subassembly mounting block. Similarly if electrical contact is made via the cooling block (not shown), then an electrically conductive solder or bonding material must be used both to attach submount 1201 to the subassembly mounting block and to attach the subassembly mounting block to the cooling block. The second contact to the diode laser is made via a contact pad 1203, each diode laser being connected to contact pad 1203 via a wire bond or ribbon bond 1205.

Figure 13:
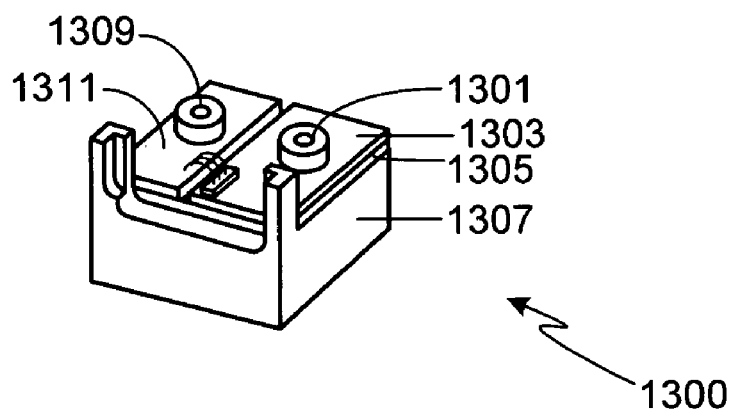
FIG. 13 illustrates portions of a diode laser subassembly that utilizes a pair of attachment bolts.

Although FIGS. 8 and 9 illustrate the use of clamping members to hold the subassemblies to the cooling block, as previously noted there are numerous other techniques that can be used to mount the subassemblies. For example, FIG. 13 shows a partial diode laser subassembly 1300 in which a first bolt 1301 holds contact pad 1303 and submount 1305 as well as mounting block 1307 to the cooling block (not shown) while a second bolt 1309 holds contact pad 1311 and submount 1305 as well as mounting block 1307 to the cooling block (not shown). Preferably in this configuration submount 1305 is fabricated from an electrically insulating material.

Figure 14:
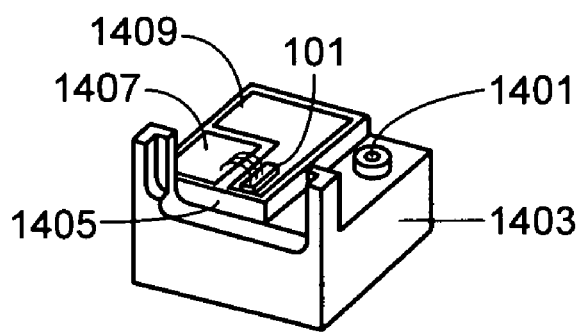
FIG. 14 illustrates portions of a diode laser subassembly that utilizes a single attachment bolt.
Figure 15:
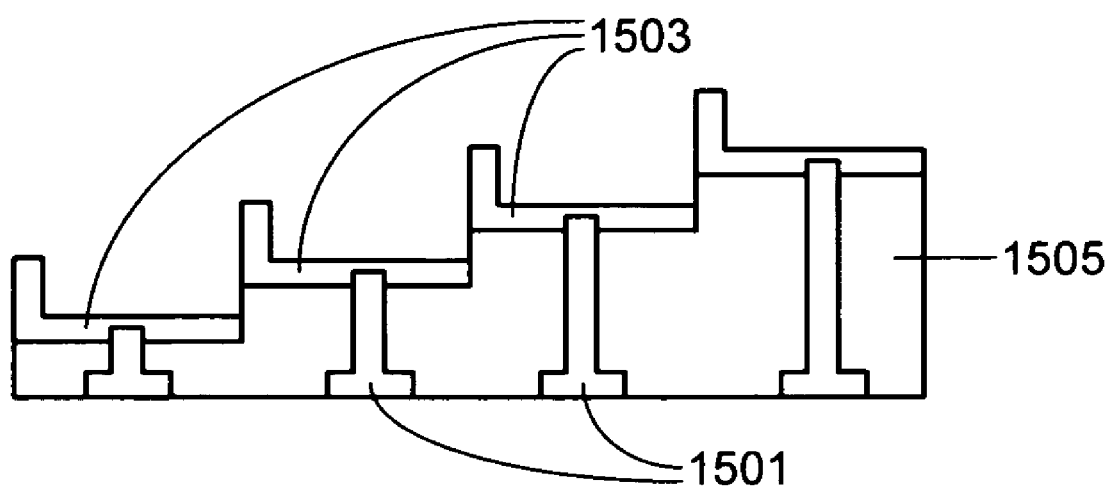
FIG. 15 is a cross-sectional view of a cooling block/mounting block that illustrates an alternate subassembly mounting arrangement.

In addition to the above-described approaches, it will be appreciated that there are numerous mounting techniques that can be used to mount the diode laser subassemblies to the cooling block, these techniques using various arrangements of clamping members, bolts and/or bonding materials (e.g., solder, adhesive). For example in the embodiment illustrated in FIG. 14, a single bolt 1401 is used to attach mounting block 1403 to the underlying cooling block (not shown). Submount 1405 is attached to mounting block 1403 by solder or an adhesive. Preferably a pair of contact pads 1407/1409 is used to electrically couple to diode laser 101. In an alternate embodiment illustrated in FIG. 15, at least one bolt 1501 attaches each mounting block 1503 to cooling block 1505, the bolts passing through the bottom of the cooling block and being screwed into the bottom of mounting blocks 1503.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A diode laser assembly comprising:
   a stepped cooling block, said stepped cooling block comprising a first cooling block section and an adjacent second cooling block section, wherein each of said first and second cooling block sections includes a plurality of stepped mounting surfaces of increasing height relative to a plane corresponding to a lowermost portion of a cooling block bottom surface, wherein adjacent stepped mounting surfaces of said first and second cooling block sections are non-coplanar with said stepped mounting surfaces of said first cooling block section positioned lower than said adjacent stepped mounting surfaces of said second cooling block section;
   a plurality of diode laser subassemblies, wherein each of said diode laser subassemblies is comprised of:
      a mounting block;
      an electrically insulating diode laser submount mounted to said mounting block, wherein said diode laser submount is comprised of an electrically insulating material;
      a diode laser mounted to said diode laser submount, wherein said diode laser is a single emitter diode laser;
      a first beam conditioning lens mounted to said mounting block, wherein an output beam from said diode laser passes through said first beam conditioning lens; and
      a second beam conditioning lens mounted to said mounting block, wherein a second output beam from a different diode laser subassembly of said plurality of diode laser subassemblies passes through said second beam conditioning lens; and
   means for mounting each of said plurality of diode laser subassemblies onto corresponding stepped mounting surfaces of said plurality of stepped mounting surfaces of said first cooling block section of said stepped cooling block, wherein each output beam from said plurality of diode laser subassemblies is displaced relative to an adjacent output beam.

2. The diode laser assembly of claim 1, wherein each of said first beam conditioning lenses comprises a cylindrical lens.

3. The diode laser assembly of claim 1, wherein said different diode laser subassembly is adjacent to said diode laser subassembly comprising said second beam conditioning lens.

4. A diode laser assembly comprising:
   a stepped cooling block, said stepped cooling block comprising a first cooling block section and an adjacent second cooling block section, wherein each of said first and second cooling block sections includes a plurality of stepped mounting surfaces of increasing height relative to a plane corresponding to a lowermost portion of a cooling block bottom surface, wherein adjacent stepped mounting surfaces of said first and second cooling block sections are non-coplanar with said stepped mounting surfaces of said first cooling block section positioned lower than said adjacent stepped mounting surfaces of said second cooling block section;

a plurality of diode laser subassemblies, wherein each of said diode laser subassemblies is comprised of:
- a mounting block;
- an electrically insulating diode laser submount mounted to said mounting block, wherein said diode laser submount is comprised of an electrically insulating material;
- a diode laser mounted to said diode laser submount, wherein said diode laser is a single emitter diode laser; and means for mounting each of said plurality of diode laser subassemblies onto corresponding stepped mounting surfaces of said plurality of stepped mounting surfaces of said first cooling block section of said stepped cooling block, wherein each output beam from said plurality of diode laser subassemblies is displaced relative to an adjacent output beam, wherein said mounting means further comprises a plurality of clamping members attached to said plurality of stepped mounting surfaces of said second cooling block section of said stepped cooling block, wherein said plurality of clamping members corresponds to said plurality of diode laser subassemblies.

5. The diode laser assembly of claim 4, wherein each clamping member of said plurality of clamping members compresses a portion of each diode laser submount against a portion of each mounting block of each corresponding diode laser subassembly of said plurality of diode laser subassemblies and compresses said portion of each mounting block against a portion of each corresponding stepped mounting surface of said first cooling block section.

6. The diode laser assembly of claim 5, wherein each clamping member of said plurality of clamping members compresses at least one electrical interconnect against at least one electrical contact pad on said portion of each diode laser submount.

7. The diode laser assembly of claim 4, further comprising a plurality of bolts corresponding to said plurality of clamping members, wherein said plurality of bolts are attached to said plurality of stepped mounting surfaces of said second cooling block section of said stepped cooling block.

8. A diode laser assembly comprising:
a stepped cooling block, said stepped cooling block comprising a first cooling block section and an adjacent second cooling block section, wherein each of said first and second cooling block sections includes a plurality of stepped mounting surfaces of increasing height relative to a plane corresponding to a lowermost portion of a cooling block bottom surface, wherein adjacent stepped mounting surfaces of said first and second cooling block sections are non-coplanar with said stepped mounting surfaces of said first cooling block section positioned lower than said adjacent stepped mounting surfaces of said second cooling block section;

a plurality of diode laser subassemblies, wherein each of said diode laser subassemblies is comprised of:
- a mounting block;
- a diode laser submount mounted to said mounting block; and
- a diode laser mounted to said diode laser submount;
- a first beam conditioning lens mounted to said mounting block, wherein an output beam from said diode laser passes through said first beam conditioning lens;
- a second beam conditioning lens mounted to said mounting block, wherein a second output beam from a different diode laser subassembly of said plurality of diode laser subassemblies passes through said second beam conditioning lens; and means for mounting each of said plurality of diode laser subassemblies onto corresponding stepped mounting surfaces of said plurality of stepped mounting surfaces of said first cooling block section of said stepped cooling block, wherein each output beam from said plurality of diode laser subassemblies is displaced relative to an adjacent output beam.

* * * * *